United States Patent
Matsumoto et al.

(10) Patent No.: US 10,388,347 B2
(45) Date of Patent: Aug. 20, 2019

(54) NON-COLLINEAR MAGNETORESISTIVE DEVICE

(71) Applicant: NATIONAL INSTITUTE OF ADVANCED INDUSTRIAL SCIENCE AND TECHNOLOGY, Tokyo (JP)

(72) Inventors: Rie Matsumoto, Tsukuba (JP); Hiroko Arai, Tsukuba (JP); Shinji Yuasa, Tsukuba (JP); Hiroshi Imamura, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/576,271

(22) PCT Filed: May 19, 2016

(86) PCT No.: PCT/JP2016/064924
§ 371 (c)(1),
(2) Date: Nov. 21, 2017

(87) PCT Pub. No.: WO2016/186178
PCT Pub. Date: Nov. 24, 2016

(65) Prior Publication Data
US 2018/0151214 A1 May 31, 2018

(30) Foreign Application Priority Data
May 21, 2015 (JP) .................... 2015-103909

(51) Int. Cl.
*G11C 11/16* (2006.01)
*H01L 43/08* (2006.01)
(Continued)

(52) U.S. Cl.
CPC ........ *G11C 11/1675* (2013.01); *G11C 11/161* (2013.01); *H01F 10/3236* (2013.01);
(Continued)

(58) Field of Classification Search
CPC ............................ G11C 11/1675; H01L 43/02
(Continued)

(56) References Cited

U.S. PATENT DOCUMENTS 8,786,039 B2 * 7/2014 Apalkov ................. H01L 43/08
257/421
9,460,397 B2 * 10/2016 Apalkov ................. H01L 43/08
(Continued)

FOREIGN PATENT DOCUMENTS

JP 2012-104825 A 5/2012
JP 2012-531747 A 12/2012
(Continued)

OTHER PUBLICATIONS

International Search Report for PCT Patent App. No. PCT/JP2016/064924 (dated Jul. 19, 2016) with English language translation thereof.
(Continued)

*Primary Examiner* — Igwe U Anya
(74) *Attorney, Agent, or Firm* — Kenealy Vaidya LLP

(57) ABSTRACT

Some embodiments are directed to a non-collinear magnetoresistive device, including a free layer; a fixed layer; and a non-magnetic layer disposed between the free layer and the fixed layer, wherein the fixed layer has an easy magnetization direction in an in-plane direction or in a perpendicular direction, the free layer satisfies at room temperature expressions (1) and (2) below:

$$E_{RT} \geq 1.66 \times 10^{-19} \, J \quad (1)$$

$$V \leq 5 \times 10^4 \, nm^3 \quad (2)$$

(Continued)

where $E_{RT} = (K_{u1,eff} + K_{u2} + K_{u1,eff}^2/4K_{u2}) \times V$, $K_{u1,eff}$: an effective first-order anisotropy constant, $K_{u2}$: a second-order anisotropy constant, and V: a volume, and wherein the free layer is in a cone magnetization state.

8 Claims, 8 Drawing Sheets

(51) Int. Cl.
    *H01F 10/32* (2006.01)
    *H01L 43/02* (2006.01)
    *H01L 43/10* (2006.01)

(52) U.S. Cl.
    CPC ......... *H01F 10/3286* (2013.01); *H01L 43/02* (2013.01); *H01L 43/08* (2013.01); *H01L 43/10* (2013.01); *H01F 10/325* (2013.01); *H01F 10/329* (2013.01); *H01F 10/3254* (2013.01)

(58) Field of Classification Search
    USPC ........................................................ 257/421
    See application file for complete search history.

(56) References Cited

U.S. PATENT DOCUMENTS

| | | | |
|---|---|---|---|
| 2006/0030775 A1* | 2/2006 | Adams | G01S 7/52033 600/437 |
| 2009/0296462 A1 | 12/2009 | Kent et al. | |
| 2012/0112295 A1 | 5/2012 | Apalkov et al. | |
| 2013/0009260 A1* | 1/2013 | Apalkov | H01L 43/08 257/421 |
| 2014/0175582 A1* | 6/2014 | Apalkov | H01L 43/08 257/425 |
| 2016/0196859 A1* | 7/2016 | Schafer | G11C 11/161 365/158 |

FOREIGN PATENT DOCUMENTS

| | | |
|---|---|---|
| JP | 2013-021328 A | 1/2013 |
| WO | WO2012/021297 A1 | 2/2012 |

OTHER PUBLICATIONS

Written Opinion for PCT Patent App. No. PCT/JP2016/064924 (dated Jul. 19, 2016).

\* cited by examiner

NON-COLLINEAR MAGNETORESISTIVE DEVICE

CROSS REFERENCE TO RELATED APPLICATION(S)

This application is a national phase filing under 35 C.F.R. § 371 of and claims priority to PCT Patent Application No. PCT/JP2016/064924, filed on May 19, 2016, which claims the priority benefit under 35 U.S.C. § 119 of Japanese Patent Application No. 2015-103909, filed on May 21, 2015, the contents of each of which are hereby incorporated in their entireties by reference.

BACKGROUND

Some embodiments are directed to a magnetoresistive device, and in particular, relates to a non-collinear magnetoresistive device that has non-collinear magnetization configuration.

A magnetoresistive device (hereinafter simply termed an MR device) fundamentally has a three-layered structure, which is constituted with a free layer, a fixed layer, and a non-magnetic layer disposed between those two layers. From the viewpoint of the principle on which MR devices work, there are two types of MR devices: one that exploits the giant magnetoresistance effect (GMR: Giant Magnetoresistance Effect), and the other that exploits the tunnel magnetoresistance effect (TMR: Tunnel Magnetoresistance Effect). With both of these types of MR devices, the orientations of magnetization of the free layer and of the fixed layer being parallel or being anti-parallel, corresponds to either of "0" and "1" of a digital signal. It is expected that MR devices will be implemented in practice as storage cells or unit cells in an MRAM (magnetoresistive random access memory) which will be an alternative to the DRAMs and SRAMs that are currently in wide use. Since MR devices can be miniaturized, it is expected that they will be put into practical use as memory cells for gigabit class non-volatile memories.

Writing information into an MR device is performed by applying a current (i.e. a current pulse) in the direction perpendicular to the three layers of the MR device. When current is applied to the MR device in this manner, spin transfer torque (STT) acts upon the free layer. Depending on the direction in which the current flows, the magnetization configuration of the free layer and the fixed layer is changed from parallel configuration to anti-parallel configuration, or conversely is changed from anti-parallel configuration to parallel configuration. Reading out information from the MR device is performed by utilizing the fact that there is a difference in the magnitude of the magnetic resistance (MR) between the free layer and the fixed layer depending on the magnetization configuration of the free layer and the fixed layer is in the parallel configuration or in the anti-parallel configuration (i.e., the magnetoresistance effect). When a current is applied so as to flow in the direction perpendicular to the MR device, the voltage between the free layer and the fixed layer differs depending on whether the magnetization configuration of the free layer and the fixed layer is in the parallel configuration or in the anti-parallel configuration.

While, in the initially produced MR devices, an easy magnetization directions of the free layer and the fixed layer were in-plane (in-plane type), in improved MR devices which have been produced thereafter, an easy magnetization directions of the free layer and the fixed layer were in perpendicular to the plane (perpendicular type). In both the in-plane type MR devices and the perpendicular type MR devices, the easy magnetization directions of the free layer and the fixed layer are the same. In other words, if the easy magnetization direction of the free layer is in perpendicular, then the easy magnetization direction of the fixed layer is also in perpendicular. An MR device in which the easy magnetization directions of the free layer and the fixed layer are the same is termed a collinear MR device. In most cases, both the free layer and the fixed layer are each composed of a ferromagnetic material crystal. In that case, the easy magnetization directions of these layers are the same direction as the c-axis of the crystal axis.

However, collinear MR devices generally have a relatively long writing time (switching time). The shortest switching time that has been currently reported is 3 ns (nanoseconds) for practical use MR devices. In view of future developments, in particular, of the application in L1 cache memories (primary cache memories), it may be required for the MR devices to have a switching time as short as 1 ns or shorter.

To solve this problem, there has been proposed a non-collinear MR device that has a magnetization configuration that is not collinear, that is, that has a non-collinear magnetization configuration. The non-collinear MR device has a tilted easy magnetization direction (in the free layer). To achieve such a tilt, it has been proposed that the MR device is produced by using an oblique evaporation method, so that it has a tilted crystal axis (in the fixed layer). However, the oblique evaporation method is a special method, with which it is difficult to control a crystal growth.

Accordingly, it has been proposed to obtain a non-collinear MR device by improving the device construction instead of using the special oblique evaporation method. PTL#1 discloses such a non-collinear MR device, which has biaxial anisotropy, and also discloses a non-collinear MR device having "cone anisotropy" (see, for example, paragraph 041 of PTL#1).

CITATION LIST

Patent Literature

PTL#1: International Patent Publication WO 2012/021297 A

SUMMARY OF INVENTION

Technical Problem

However, PTL#1 fails to provide a detailed disclosure about the MR device and does not disclose a non-collinear MR device that maintains a "cone magnetization state" at room temperature.

An aspect of some embodiments is to provide a nonvolatile non-collinear MR device that maintains a "cone magnetization state" at room temperature and has a data retention time of ten years or longer per unit cell.

Solution to Problem

According to the first aspect of some embodiments, a non-collinear magnetoresistive device, includes: a free layer; a fixed layer; and a non-magnetic layer disposed between the free layer and the fixed layer, wherein the fixed layer has an easy magnetization direction in an in-plane direction or in a perpendicular direction, the free layer satisfies at room temperature expressions (1) and (2) below:

$$E_{RT} \geq 1.66 \times 10^{-19} J \quad (1)$$

$$V \leq 5 \times 10^4 \text{ nm}^3 \quad (2)$$

where $E_{RT}=(K_{u1,eff}+K_{u2}+K_{u1,eff}^2/4K_{u2})\times V$, $K_{u1,eff}$: an effective first-order anisotropy constant, $K_{u2}$: a second-order anisotropy constant, and V: a volume, and wherein the free layer is in a cone magnetization state.

According to the second aspect of some embodiments, a non-collinear magnetoresistive device, includes: a free layer; a fixed layer; and a non-magnetic layer disposed between the free layer and the fixed layer, wherein the fixed layer has an easy magnetization direction in an in-plane direction or in a perpendicular direction, the free layer satisfies at room temperature expressions (1) to (4) below:

$$E_{RT} \geq 1.66 \times 10^{-19} J \quad (1)$$

$$V \leq 5 \times 10^4 \text{ nm}^3 \quad (2)$$

$$K_{u2} > -(1/2)K_{u1,eff} \quad (3)$$

$$K_{u1,eff} < 0 \quad (4)$$

where $E_{RT}=(K_{u1,eff}+K_{u2}+K_{u1,eff}^2/4K_{u2})\times V$, $K_{u1,eff}$: an effective first-order anisotropy constant, $K_{u2}$: a second-order anisotropy constant, and V: a volume.

According to the third aspect of some embodiments, the non-collinear magnetoresistive device according to the first or second aspect, it is possible that the free layer has uniaxial anisotropy. According to the fourth aspect of some embodiments, the non-collinear magnetoresistive device according to any one of the first through third aspects, it is possible that the free layer includes one of: (1) a multi-layer film in which a thin layer containing Co and a thin layer containing Pt or Pd are laminated repeatedly, (2) a superlattice film containing Pt or Pd, in addition to Co, or (3) an thin alloy film containing Co having an hcp structure.

DESCRIPTION OF EMBODIMENTS

First, the background of some embodiments is explained before embodiments of the presently disclosed subject matter are explained.

Figure 1:
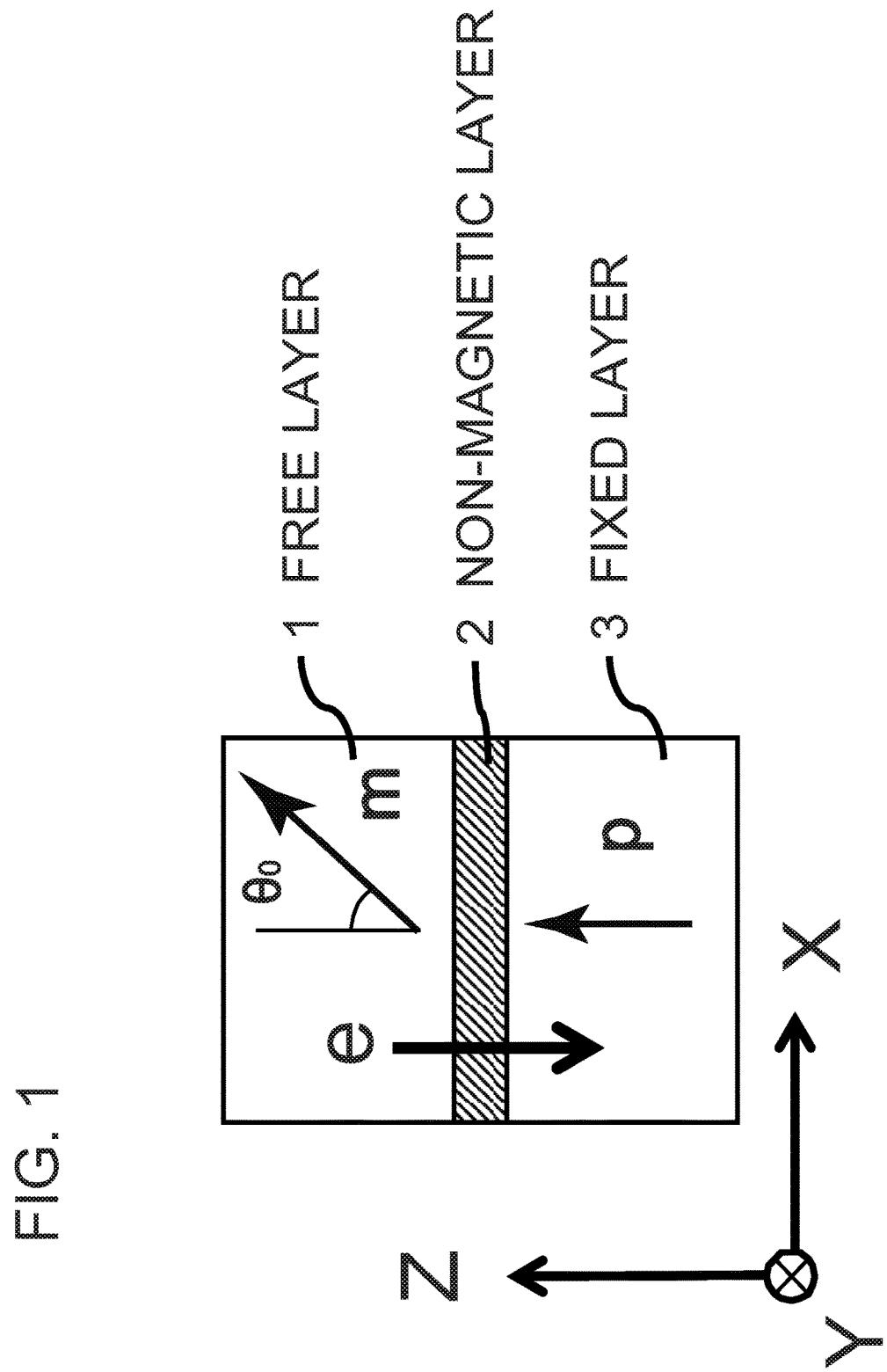
FIG. 1 is a conceptual figure showing a vertical sectional view of (an example of) a perpendicular type non-collinear magnetoresistive device.
Figure 2:
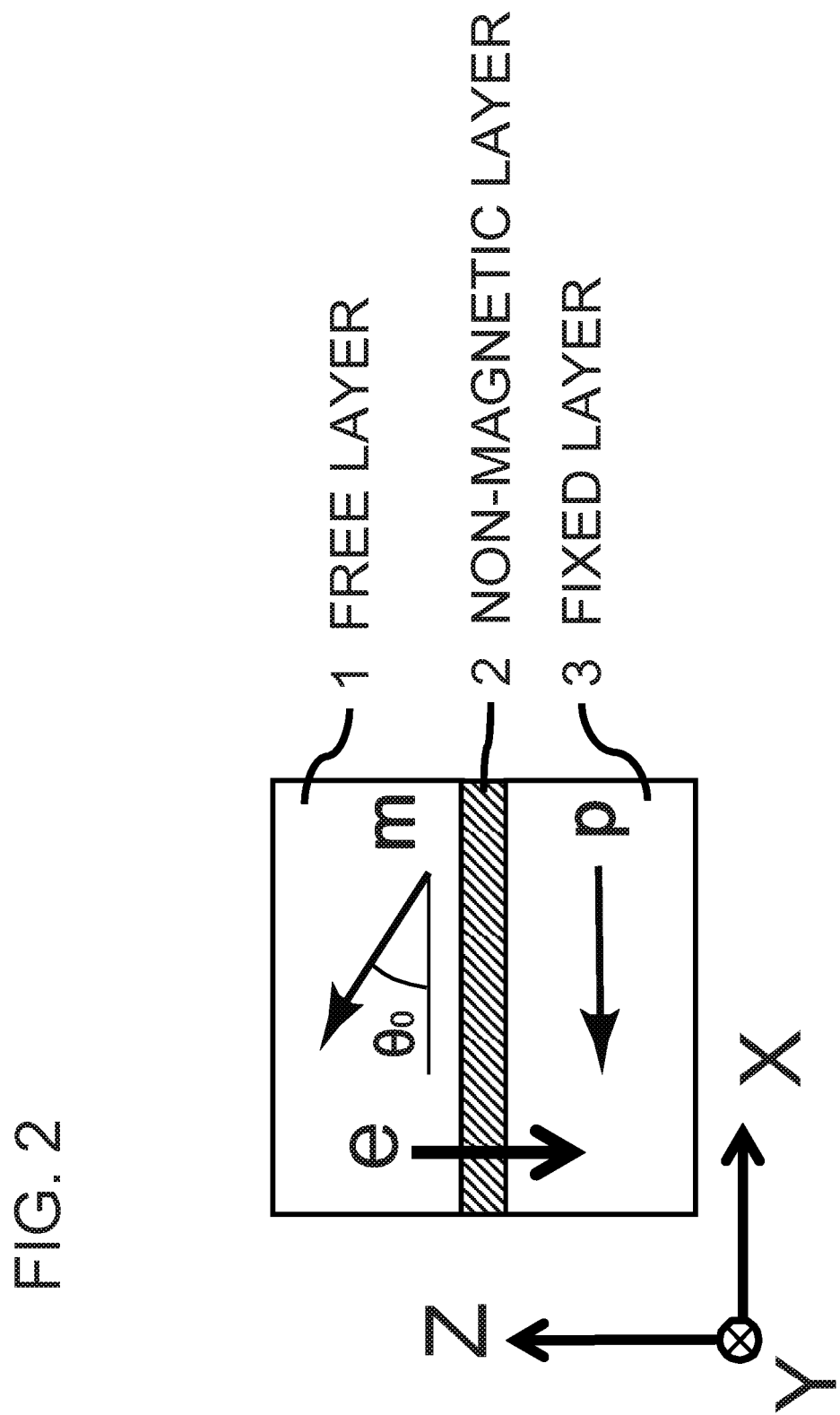
FIG. 2 is a conceptual figure showing a vertical sectional view of (an example of) an in-plain type non-collinear magnetoresistive device.

Theoretically, not the free layer but the fixed layer can have the tilted easy magnetization direction in a cone magnetization state. However, it is possible to tilt the easy magnetization direction of the free layer in a cone magnetization state. This is because it is desired that the magnetization direction of the fixed layer be stable for a longer time than the magnetization direction of the free layer. Incidentally, PTL#1 described above relates to MR devices in which the free layer is in a cone magnetization state. Accordingly, the inventors of some embodiments have paid attention to a non-collinear MR device whose free layer is in a cone magnetization state. FIG. 1 shows a vertical sectional view of (an example of) a perpendicular type non-collinear magnetoresistive device. FIG. 2 shows a vertical sectional view of (an example of) an in-plain type non-collinear magnetoresistive device. Note that the arrows with symbols e in FIGS. 1 and 2 show the directions in which electrons flow at a positive current density. Hereinafter, explanation will proceed taking the perpendicular type MR device in FIG. 1 as an example. However, a similar explanation also holds for the case of the in-plane type MR device shown in FIG. 2.

In connection with MR devices, up until the present time, the second-order term $K_{u2}$ among the uniaxial anisotropy energy which is expressed with the constants ($K_{u1,eff}$, $K_{u2}$) has been ignored, since $K_{u2}$ is comparatively small. The inventors of some embodiments have concentrated their attention upon the second-order term ($K_{u2}$) that has hitherto been ignored, and have focused on their attention on a ferromagnetic material that has a relatively large second-order term ($K_{u2}$) at room temperature (300 Kelvin), that is, which satisfies an expression (3) below:

$$K_{u2} > -(1/2)K_{u1,eff} \quad (3)$$

At the same time, the inventors of some embodiments have focused their attention on a material that has a negative effective first-order term ($K_{u1,eff}$), that is, that satisfies an expression (4) below:

$$K_{u1,eff} < 0 \quad (4).$$

Figure 3:
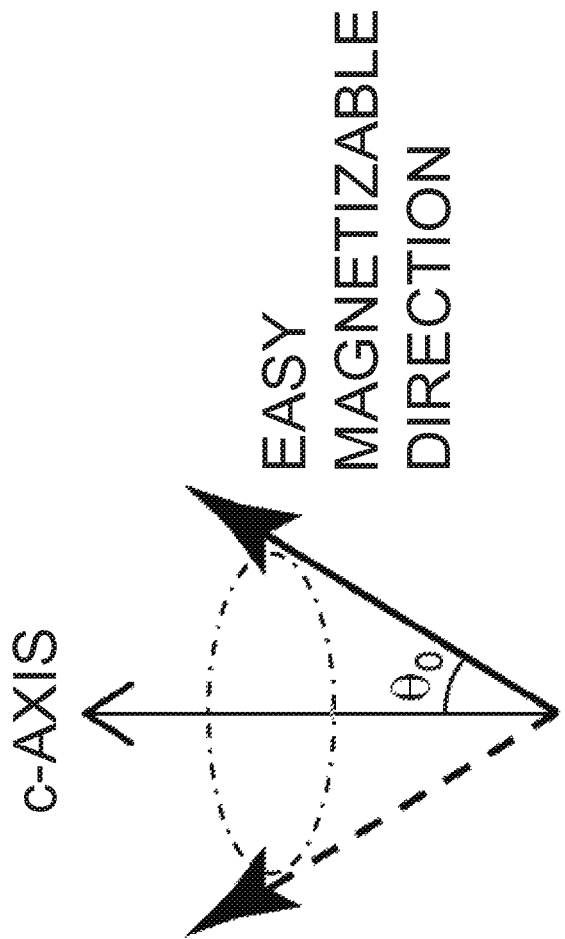
FIG. 3 is a conceptual figure explaining a cone magnetization state.

That is, the inventors of some embodiments have focused their attention on a ferromagnetic material that satisfies both the expressions (3) and (4) simultaneously. The ferromagnetic material that satisfies the expressions (3) and (4) simultaneously has a magnetization state of "cone magnetization state" in spite of having a perpendicular crystal axis, and has an easy magnetization direction that is tilted from the crystal axis. FIG. 3 is a conceptual figure explaining the cone magnetization state. As shown in FIG. 3, in the cone magnetization state, the easy magnetization direction $m_0$ is at arbitrary position on the conical surface. Note that FIG. 3 does not show that the magnetization direction rotates. Even if the magnetization (arrow) reverses, the magnetization direction is still on the conical surface. However, the tail or head of the arrow is on the crystal axis (c-axis in FIG. 3). Since this MR device is of the perpendicular type, its c-axis is in the perpendicular direction (Z-axis).

As a result of extensive investigation, the inventors of the presently disclosed subject matter have found that the non-collinear MR device according to an embodiment of some embodiments, more specifically, the non-collinear MR device according to the embodiment explained below, achieves the aspect of some embodiments.

An embodiment of the non-collinear MR device according to the presently disclosed subject matter is explained. In the following description, some embodiments are explained taking a perpendicular type MR device as an example. Some embodiments also work with the in-plane type MR device (FIG. 2) as already described above. The structure of the MR device is conceptually shown in FIG. 1. This MR device includes a free layer 1 (upper layer), a fixed layer 3 (lower layer), and a non-magnetic layer 2 (intermediate layer) disposed between the free layer 1 and the fixed layer 3. Here, the free layer 1 is in a cone magnetization state and the fixed layer 3 has an easy magnetization direction in the perpendicular direction. Hereinafter, each layer of the MR device shown in FIG. 1 is mainly explained.

1. $E_{RT}$ of Free Layer

The free layer in the MR device according to an embodiment of the presently disclosed subject matter has an $E_{RT}$ equal to or larger than $1.66 \times 10^{-19}$ J. That is, the free layer satisfies an expression (1) below:

$$E_{RT} \geq 1.66 \times 10^{-19} J \quad (1)$$

where $$E_{RT} = (K_{u1,eff} + K_{u2} + K_{u1,eff}^2/4K_{u2}) \times V;$$

$K_{u1,eff}$: an effective first-order anisotropy constant;
$K_{u2}$: a second-order anisotropy constant; and
V: a volume.

Under this condition, the data retention time per unit cell (1 bit) of 10 years or longer is achieved. It is desirable that $E_{RT}$ will have a larger value in case that a large number of unit cells are arranged on one substrate to fabricate a large capacity memory. For assuring data retention of the substrate (memory) in whole, it is desirable that one unit cell has much higher $E_{RT}$ in view of probability. For example, possible $E_{RT}$ (unit: ×10$^{-19}$ J) for a memory of capacity of 256 Mbit to 16 Gbit is as shown in Table 1 below. Here, it is desirable that $E_{RT}$ be higher than $1.66 \times 10^{-19}$ J in the expression (1). Note that $E_{RT}$ has a possible value (range) in terms of "$E_{RT}/(k_B T)$". This is also shown in Table 1. In table 1, $k_B$ indicates Boltzmann constant and T indicates Kelvin temperature.

TABLE 1

| | Capacity of memory | | |
|---|---|---|---|
| | 16 Gbit | 8 Gbit | 4 Gbit |
| Diameter of unit cell | φ 14 nm | φ 25 nm | φ 35 nm |
| $E_{RT}$ | ≥2.65 | ≥2.61 | ≥2.57 |
| $E_{RT}/(k_B T)$ | ≥64 | ≥63 | ≥62 |

| | Capacity of memory | | |
|---|---|---|---|
| | 1 Gbit | 512 Mbit | 256 Mbit |
| Diameter of unit cell | φ 60 nm | φ 80 nm | φ 110 nm |
| $E_{RT}$ | ≥2.53 | ≥2.49 | ≥2.44 |
| $E_{RT}/(k_B T)$ | ≥61 | ≥60 | ≥59 |

While the upper limit of $E_{RT}$ is not defined in some embodiments, $E_{RT}$ having a value beyond necessity will need more power consumption for information writing and thus is undesirable. Rather, it is more desirable for $E_{RT}$ to have a value closer to the lower limit value of the expression (1) or of the values in Table 1. Also, $E_{RT}$ is proportional to the volume V so that $E_{RT}$ has a limitation due to the capacity of the memory. The larger the capacity and/or the higher density of a memory is, the smaller the volume V of a unit cell in the memory should be. Therefore, in consideration for being applied to a large capacity and/or high density memory, the free layer in an embodiment of the presently disclosed subject matter may be required to satisfy, as well as satisfying the expression (1), the expression (2) below:

$$V \leq 5 \times 10^4 \text{ nm}^3 \quad (2)$$

2. Cone Magnetization State of the Free Layer

Figure 4:
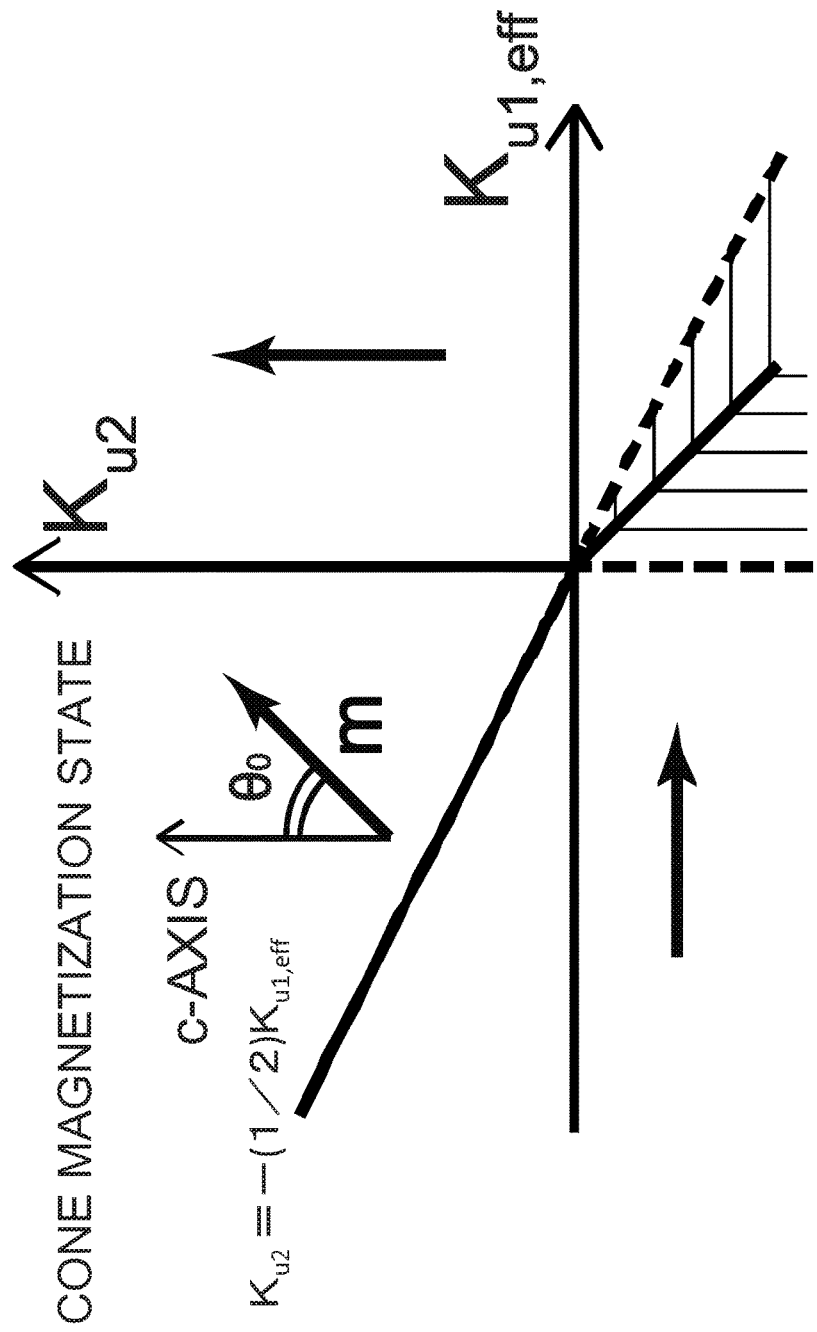
FIG. 4 is a phase diagram showing a region in which a cone magnetization state is stable.

The cone magnetization state of the free layer will be explained with reference to FIGS. 1 and 3. The magnetization direction of the free layer is defined to be m. When the magnetization of the free layer is oriented in the easy magnetization direction $m_0$, the relationship $m=m_0$ is satisfied. The easy magnetization direction $m_0$ of the free layer is on a conical surface. When an external stimulation such as current or heat is applied to the free layer, m does not stay at $m_0$. It is assumed that the tilt angle of m (polar angle) is θ, the polar angle of $m_0$ is $θ_0$, and the azimuth angle of m is $φ_m$ (arbitrary value). The cone magnetization state is stable when uniaxial anisotropy constants ($K_{u1,eff}$, $K_{u2}$) in the free layer satisfy the expressions (3) and (4), simultaneously. FIG. 4 is a phase diagram showing the region in which the cone magnetization state is stable. The cone magnetization state is stable in an area above a line represented by $K_{u2} = -(½)K_{u1,eff}$ and on the left side of a line represented by $K_{u1,eff} = 0$ (i.e., vertical axis) in FIG. 4. Note that in FIG. 4, the arrow in the horizontal direction indicates the in-plane magnetization state and the arrow in the vertical direction indicates the perpendicular magnetization state.

The energy density $E(θ)$ in the free layer is given by an expression (5) below.

$$E(θ) = K_{u1,eff} \sin^2 θ + K_{u2} \sin^4 θ \quad (5)$$

where $K_{u1,eff} = K_{u1} - (½)μ_0 M_s^2$, $K_{u1}$ is a first-order anisotropy constant, $μ_0$ is the magnetic permeability of vacuum, and $M_s$ is a saturation magnetization. The tilt angle (polar angle) $θ_0$ of the easy magnetization direction $m_0$ of the free layer (in cone magnetization state) is represented by an expression (6) below and is determined as a value that minimizes $E(θ)$ represented by the expression (5).

$$θ_0 = \sin^{-1}\sqrt{-K_{u1,eff}/2K_{u2}} \quad (6)$$

Figure 5:
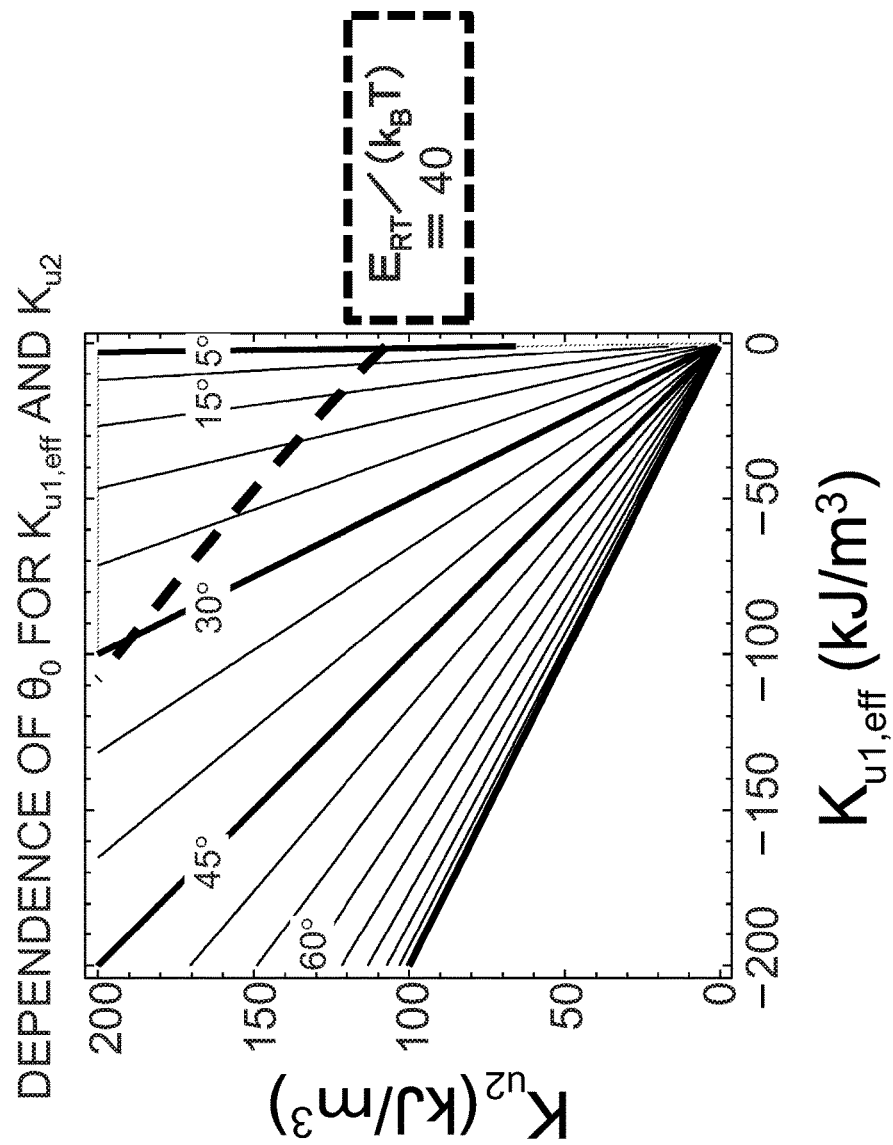
FIG. 5 is a graph explaining a dependence of $\theta_0$ for $K_{u1,eff}$ and $K_{u2}$.

FIG. 5 is a graph that explains dependency of $K_{u1,eff}$ and $K_{u2}$ to the tilt angle (polar angle) $θ_0$. As shown in FIG. 5, $θ_0$ is a decreasing function with respect to $K_{u1,eff}$ and $K_{u2}$. The larger the tilt angle $θ_0$ of the easy magnetization direction $m_0$ is, the shorter the switching time is. However, the larger the tilt angle $θ_0$ is, the smaller the MR ratio of the MR device is and accordingly, the reading speed (which is proportional to the MR ratio) becomes smaller. Therefore, in consideration of both shortening the switching time and shortening the reading time, it is desirable that $θ_0$ possibly satisfies $0° < θ_0 < 45°$, more possible, $5° < θ_0 < 30°$, and particularly possibly $10° < θ_0 < 20°$. This is also true for the in-plane type MR device (see FIG. 2).

The $K_{u1,eff}$ and $K_{u2}$ of a configuration of the free layer alone, not of a configuration of the MR device, can be measured relatively easily. Accordingly, the magnetic characteristics of the free layer alone may be measured to determine its $K_{u1,eff}$ and $K_{u2}$ before a MR device is fabricated using the free layer. Note that some embodiments are not limited to the case where the free layer in whole is in a cone magnetization state. A part of the free layer may be in a cone magnetization state. For example, a partial cone magnetization state can be achieved by generating interface magnetic anisotropy in a free layer near the interface with a non-magnetic layer or a cap layer, or the like and making the interface magnetic anisotropy and the magnetic anisotropy of the free layer cooperate with each other.

3. Material of Free Layer

Specific examples of the material of the free layer in which a cone magnetization state can be achieved include the following:

(a) A periodic multi-layer film in which a thin layer containing Co and a thin layer containing Pt or Pd are laminated repeatedly or a superlattice film containing Pt or Pd, in addition to Co.

In this case, the thin layer containing Co possibly, for example, has hcp crystalline structure or fcc(111) crystalline structure. The thin layer containing Pt or Pd possibly has, for example, an fcc(111) crystalline structure, however, some other plane orientation may also be employed. As another example, the thin layer containing Co may be fcc (001) and the thin layer containing Pt or Pd may be fcc(001). It is desirable for the thickness of one thin layer containing Co laminated over the thin layer containing Pt to be equivalent to 10 to 15 Co atoms. Furthermore, it is desirable for the thickness of one thin layer containing Co laminated over the thin layer containing Pd to be equivalent to 4.5 to 6 Co atoms.

Alternatively, a multi-layer film or a superlattice film constructed of thin layer (thickness 1.1 nm) containing Co laminated over a thin layer (thickness 2 nm) containing Pt may also be used. Furthermore, a multi-layered film obtained by repeatedly laminating together, eight times, a thin layer containing Co (thickness: 0.9 nm to 1.1 nm)/a thin layer containing Pt (thickness 2.0 nm) or a superlattice film in which a thin layer containing Co having a thickness equivalent to around 1 to 2 Co atoms and a thin film containing Pt having a thickness equivalent to around 1 to 2 Pt atoms are laminated together alternatingly for several to several tens of cycles may also be used. A multi-layer film obtained by repeatedly laminating together, eight times, a thin layer containing Co (thickness 0.7 nm)/a thin layer containing Pd (thickness 1 nm to 1.5 nm), or a superlattice film in which a thin layer containing Co having a thickness equivalent to around 1 to 2 Co atoms and a thin layer containing Pd having a thickness equivalent to around 1 to 2 Pd atoms are laminated together alternatingly for several to several tens of cycles, may also be used.

(b) A thin alloy film containing Co and having a hexagonal close-packed (hcp) structure.

Possible examples of such Co/Pt multi-layer film and Co/Pd multi-layer film are shown in Tables 2 and 3, respectively. The Co/Pt multi-layer films shown in Table 2 are films for which $K_{u1,eff}$=−20 kJ/m$^3$ and $K_{u2}$=135 kJ/m$^3$. The Co/Pd multi-layer films shown in Table 3 are films for which $K_{u1,eff}$=−10 kJ/m$^3$ and $K_{u2}$=99 kJ/m$^3$. In Tables 2 and 3, each of the numerical values indicate $E_{RT}$ values (unit: ×10$^{-19}$ J) and the numerical values in neighboring square brackets ([ ]) indicate volumes V (unit: nm$^3$). The numerical values surrounded by double line relate to examples in an embodiment of the presently disclosed subject matter, among which particularly possible examples are shown by using italic numeric characters with asterisk (*). While it has been explained above taking an example in which crystals are used as the material, it would be possible for the free layer to be a single crystal, polycrystalline material, a partial crystal, a texture, nano-crystalline material, or an amorphous materials, or mixture of some or all or most of the above.

TABLE 2

| Diameter φ | φ 14 nm (16 Gbit) | φ 25 nm (8 Gbit) | φ 35 nm (4 Gbit) |
|---|---|---|---|
| Thickness 1 nm | 0.178 [154] | 0.568 [491] | 1.11 [962] |
| Thickness 1.5 nm | 0.267 [231] | 0.852 [736] | 1.67 [1443] |
| Thickness 2 nm | 0.356 [308] | 1.14 [982] | 2.23 [1924] |
| Thickness 3 nm | 0.535 [462] | 1.70 [1473] | *3.34 [2886] |
| Thickness 4 nm | 0.713 [616] | 2.27 [1963] | 4.45 [3848] |
| Thickness 5 nm | 0.891 [770] | *2.84 [2454] | 5.57 [4811] |

| Diameter φ | φ 60 nm (1 Gbit) | φ 80 nm (512 Mbit) | φ 110 nm (256 Mbit) |
|---|---|---|---|
| Thickness 1 nm | *3.27 [2827] | *5.82 [5027] | *11.0 [9503] |
| Thickness 1.5 nm | 4.91 [4241] | 8.73 [7540] | 16.5 [14255] |
| Thickness 2 nm | 6.54 [5655] | 11.6 [10053] | 22.0 [19007] |
| Thickness 3 nm | 9.82 [8482] | 17.5 [15080] | 33.0 [28510] |
| Thickness 4 nm | 13.1 [11310] | 23.3 [20106] | 44.0 [38013] |
| Thickness 5 nm | 16.4 [14137] | 29.1 [25133] | 55.0 [47517] |

TABLE 3

| Diameter φ | φ 14 nm (16 Gbit) | φ 25 nm (8 Gbit) | φ 35 nm (4 Gbit) |
|---|---|---|---|
| Thickness 1 nm | 0.137 [154] | 0.438 [491] | 0.859 [962] |
| Thickness 1.5 nm | 0.206 [231] | 0.657 [736] | 1.29 [1443] |
| Thickness 2 nm | 0.275 [308] | 0.876 [982] | 1.72 [1924] |
| Thickness 3 nm | 0.412 [462] | 1.31 [1473] | *2.58 [2886] |
| Thickness 4 nm | 0.550 [616] | 1.75 [1963] | 3.43 [3848] |
| Thickness 5 nm | 0.687 [770] | 2.19 [2454] | 4.29 [4811] |

| Diameter φ | φ 60 nm (1 Gbit) | φ 80 nm (512 Mbit) | φ 110 nm (256 Mbit) |
|---|---|---|---|
| Thickness 1 nm | 2.52 [2827] | *4.49 [5027] | *8.48 [9503] |
| Thickness 1.5 nm | *3.79 [4241] | 6.73 [7540] | 12.7 [14255] |
| Thickness 2 nm | 5.05 [5655] | 8.97 [10053] | 17.0 [19007] |
| Thickness 3 nm | 7.57 [8482] | 13.5 [15080] | 25.4 [28510] |
| Thickness 4 nm | 10.1 [11310] | 17.9 [20106] | 33.9 [38013] |
| Thickness 5 nm | 12.6 [14137] | 22.4 [25133] | 42.4 [47517] |

4. Thickness of Free Layer

The thickness of the free layer relates to the volume V thereof and also to factors other than the volume. That is, a thin free layer, which is desirable from the viewpoint of its low threshold current density, but, conversely, has a problem that its thermal stability decreases. Moreover, a thin free layer also has a problem that it is difficult to fabricate a continuous film. On the other hand, a thicker a free layer causes a problem that magnetization reversal does not happen unless a large current is applied. Accordingly, the thickness of the free layer is generally, for example, about 1 to 10 nm, possibly about 1 to 3 nm.

5. Example 1 of Free Layer

As Example 1, a free layer constructed of two layer film of Co (thickness 0.7 nm)/Pt (thickness 1.5 nm) is presented. In this free layer, "$E_{RT}/(k_BT)$" is 43.5, saturation magnetization ($M_s$) is 400 kA/m, and the Gilbert damping constant (α) is 0.04. The vacuum permeability ($μ_0$) is $4π×10^{-7}$ H/m, and the gyromagnetic ratio (γ) is $2.21×10^5$ rad·m/A. The dimension of this free layer is as follows: thickness t=2.2 nm, diameter φ=30 nm, and volume V=$1.56×10^3$ nm$^3$. $E_{RT}$ (=$1.80×10^{-19}$ J)≥$1.66×10^{-19}$ J, and volume V≤$5×10^4$ nm$^3$.

6. Example 2 of Free Layer

As example 2, a free layer constructed of a Co alloy thin film having an hcp structure is presented. This free layer has the dimension: thickness=5 nm, diameter φ=16 nm, and volume V=$1.01×10^3$ nm$^3$. This free layer is in a cone magnetization state and has $E_{RT}$ (=$1.91×10^{-19}$ J)≥$1.66×10^{-19}$ J and a volume V ($1.01×10^3$ nm$^3$)≤$5×10^4$ nm$^3$.

7. Switching Time $T_{sw}$

Figure 6:
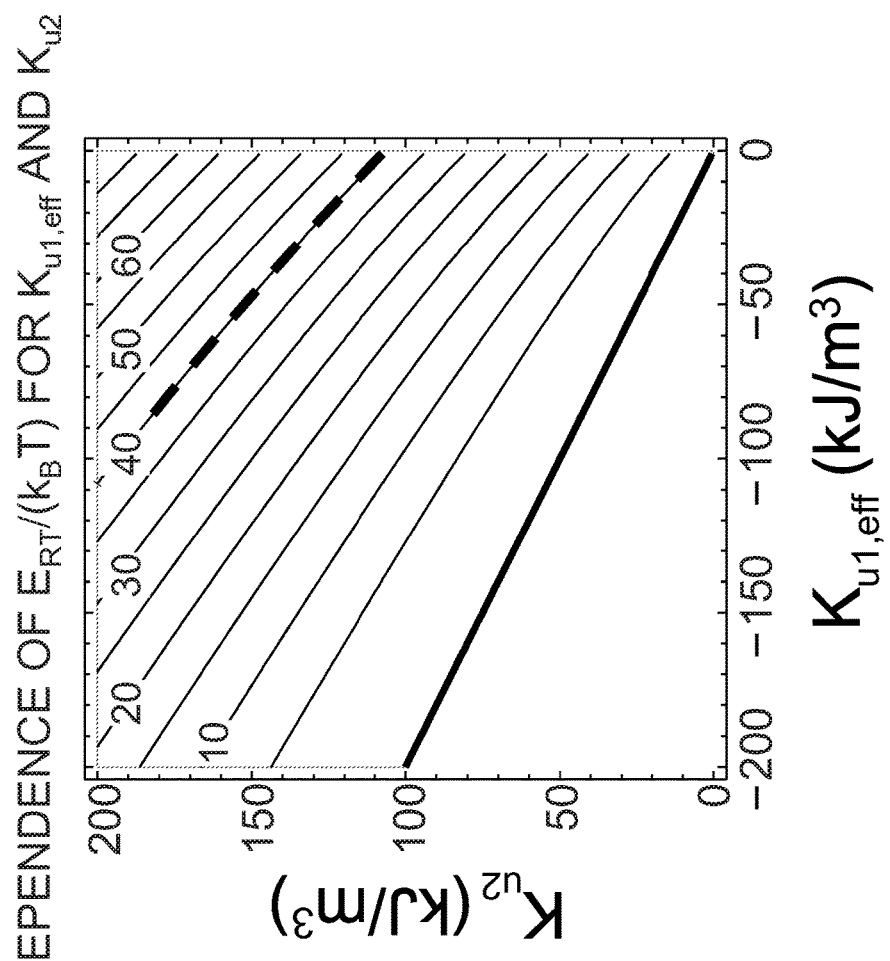
FIG. 6 is a graph explaining a dependence of "$E_{RT}/(k_B T)$" for $K_{u1,eff}$ and $K_{u2}$.

FIG. 6 shows a dependence of "$E_{RT}/(k_BT)$" for $K_{u1,eff}$ and $K_{u2}$ at room temperature (T=300 Kelvin) in the dimension of "Example 1 of Free Layer". As $K_{u1,eff}$ and $K_{u2}$ increase (in the positive direction), "$E_{RT}/(k_BT)$" increases. To satisfy "$E_{RT}/(k_BT)$"≥40, $K_{u2}$ may be required to be greater than 107 kJ/m³. The anisotropy constants ($K_{u1,eff}$, $K_{u2}$) that satisfy "$E_{RT}/(k_BT)$"=40 are indicated in bold broken line. In Example 1 of the free layer described above, $K_{u1,eff}$=−20 kJ/m³ and $K_{u2}$=135 kJ/m³. The tilt angle $\theta_0$ is 15.8°.

Figure 7:
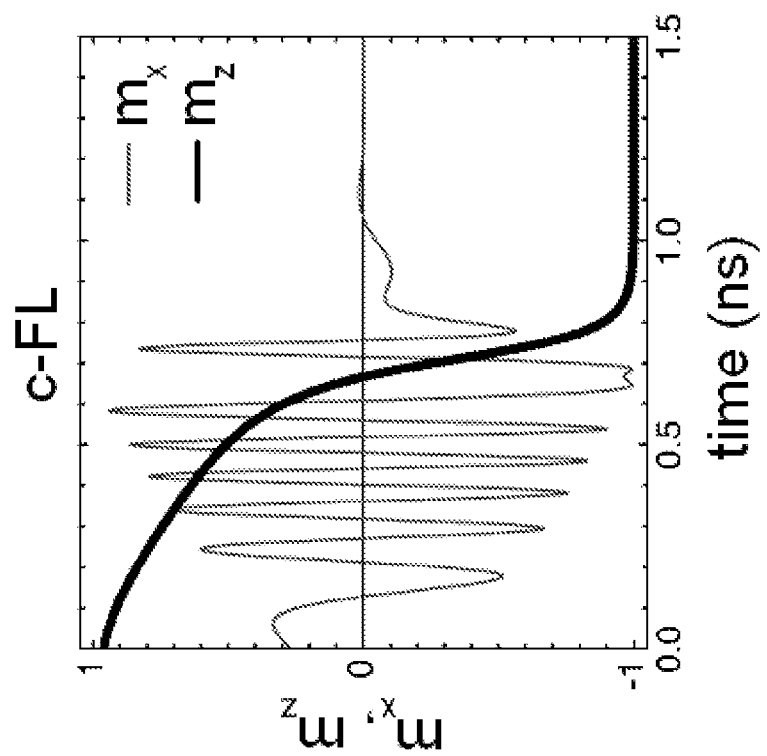
FIG. 7 is a graph explaining a typical magnetization reversal.

Assuming that the current density of current that is applied to the MR device is $J_D$, a positive current density $J_D$ (>0) indicates that electrons flow from the free layer to the fixed layer. FIG. 7 shows a typical state of magnetization reversal as one example in case the positive current density $J_D$=15×10⁶ A/cm² is selected. In this case, $K_{u1,eff}$ is −20 kJ/m³, $K_{u2}$ is 135 kJ/m³, $\theta_0$ is 15.8°, and "$E_{RT}/(k_BT)$" is 43.5. The switching time $T_{sw}$ is a time period that may be required for moving m from the position of $\theta=\theta_0$ (rad) to the position of $\theta=\pi/2$ (rad), and $T_{sw}$ is obtained by an expression (7) below.

$$T_{SW} = (1/\gamma M_S)\int_{\theta_0}^{\pi/2}(d\theta/d\tau)^{-1}d\theta \quad (7)$$

where $\gamma$ indicates a gyromagnetic ratio, $M_s$ indicates saturation magnetization, and $\tau$ indicates dimensionless time. $\tau$ is related to time t (s) so as to satisfy $\tau=\gamma M_s t$.

Figure 8:
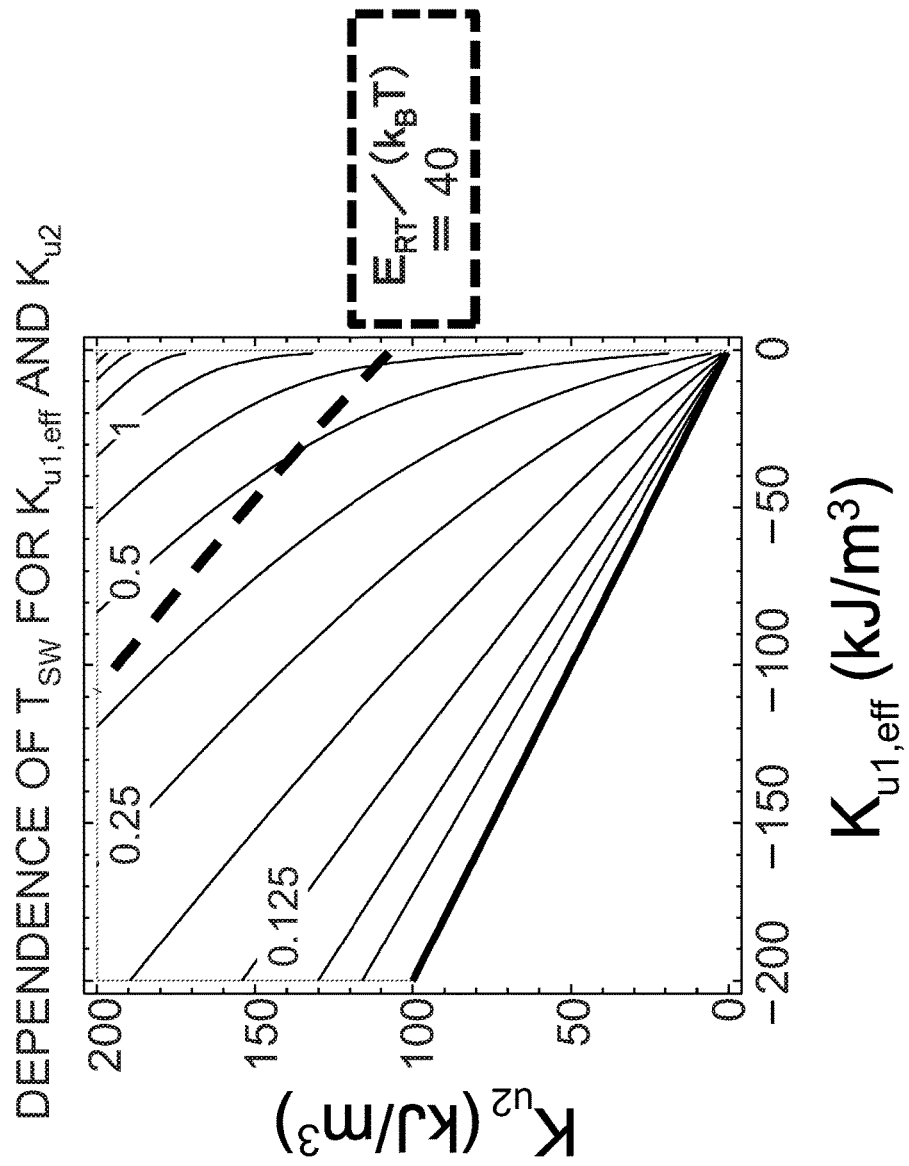
FIG. 8 is a graph explaining a dependence of switching time $T_{sw}$ for $K_{u1,eff}$ and $K_{u2}$.

Calculation using the expression (7) reveals that $T_{sw}$ is 0.67 ns for Example 1 of the free layer. In contrast, $T_{sw}$ of a collinear MR device that has been reported to be shortest is, for example, about 3 ns. FIG. 8 shows a dependence of $T_{sw}$ for $K_{u1,eff}$ and $K_{u2}$ at a positive current density $J_D$=16×10⁶ (A/cm²), as one example. The larger $\theta$ is, the larger STT is, and hence the larger $\theta_0$ is, the shorter the switching time $T_{sw}$ is. At the state in which anisotropy constant is in condition of "$E_{RT}/(k_BT)$" is 40, the switching time $T_{sw}$ is below 1 ns. Therefore, the switching time $T_{sw}$ (0.67 ns) in the example of some embodiments is shortened to about ⅕ times (22%) as compared with the switching time of a conventional example (about 3 ns). With regard to the threshold current density $J_{sw}$ that may be required for switching, the threshold current density $J_{sw}$ (9.46×10⁶ A/cm²) of Example 1 is reduced by about 22% as compared with the threshold current density of the conventional example (13.5×10⁶ A/cm²) that has the same $E_{RT}$ and V as those of Example 1.

8. Non-Magnetic Layer

Materials for the non-magnetic layer located between the free layer and the fixed layer, which materials are known per se, are divided into (1) a non-magnetic metal (for GMR device) and (2) an insulator material (for TMR device). In the TMR device, the non-magnetic layer is also called a tunnel barrier layer. In the MR device in the embodiment of the presently disclosed subject matter, these conventional materials may be used for the non-magnetic layer. The followings are specific examples of the materials for the non-magnetic layer.

(1) Non-Magnetic Metals

For example, metals including Cu, Ag, or Cr or the like or alloys of these metals can be used. The non-magnetic layer has a thickness of, for example, about 0.3 nm to 10 nm. In particular, when metal or alloy containing Cu or Ag to achieve a large MR ratio is adopted as a non-magnetic layer, the thickness of the non-magnetic layer is, for example, 2 nm to 10 nm.

(2) Insulator Materials

Various dielectric materials, for example, oxides, nitrides, halides and the like of Mg, Al, Si, Ca, Li or the like can be used. In particular, it is possible that Mg—O (magnesium oxide) that can achieve both of a large MR ratio and a small surface resistance is used. In case that oxide or nitride is used for the non-magnetic layer, some amounts of oxygen deficiency or nitrogen deficiency may be present in the oxide or nitride. The non-magnetic layer has a thickness of, for example, 0.3 nm to 2 nm.

9. Fixed Layer

The fixed layer is a ferromagnetic material layer having an easy magnetization direction in a perpendicular direction (in case the MR device is an in-plane type, the easy magnetization direction is in-plane direction). Such a ferromagnetic material has been known per se. In the MR device in an embodiment of the presently disclosed subject matter, such a conventional material can be used for the fixed layer. Specific examples of such conventional materials are explained below. As typical materials, for example, ferromagnetic metals such as Fe, Co, Ni or the like or ferrous alloys, for example, Fe—Co can be presented. In case that the material in an amorphous state is desired as an intermediate state because of the manufacturing process, then alloys additionally containing B (boron), Si, Ti, Cr, or V, such as Fe—B, Fe—Co—B, Fe—Co—B—Si, Fe—Co—B—Ti, Fe—Co—B—Cr, Fe—Co—B—V or the like may be used. In particular, in the case of perpendicular magnetization, alloys such as Co—Pt, Co—Pd, Fe—Pt, Fe—Pd or the like or multi-layer film made of thin layers of such an alloy, or alloys obtained by adding B or Cr or the like to these alloys can be used. In order to crystallize a film in the amorphous state, for example, thermal processing (annealing) can be used, as is well known in the art.

The thickness of the fixed layer will be described. In case that the fixed layer is thin, the fixed layer has a problem that the stability of the direction of magnetization against current or heat decreases. Moreover, the thin fixed layer has another problem that it becomes difficult to form a continuous film. Conversely, in case that the fixed layer is thick, the fixed layer causes a problem that stray magnetic field from the fixed layer to the free layer increases, and another problem that it makes the microfabrication difficult. Therefore, the thickness of the fixed layer is generally, for example, 2 to 100 nm, possibly about 2 to 10 nm, which is thicker than the thickness of the free layer.

10. Manufacturing Method

Since each of the above-mentioned layers are considerably thin, it can be formed on a substrate by using a vacuum thin-film deposition technique. As such a technique, conventional techniques, for example, a sputtering method, an evaporation method, an MBE method, an ALE method, a CVD method, and the like can be used selectively, as desired.

In the above description, only three fundamental layers, i.e. the free layer, the non-magnetic layer, and the fixed layer, have been explained. However, according to the situation, provided that the aspect of some embodiments is not contradicted, it would also be acceptable to add, in addition to these layers, some other layer or layers, such as an electrode layer for information extraction, a holding support layer that can support holding the direction of magnetization of the fixed layer, a magnetization adjustment support layer that can support adjustment of the easy magnetization direction of the free layer, a readout support layer (i.e. a dedicated readout layer) that can support enhancement of the readout signal during readout of the orientation of magnetization of the free layer, a capping layer, or the like. Furthermore, it would also be possible to dispose non-collinear MR devices according to some embodiments in the form of an array to which an electrode layer such as described above or the like is added, and to provide wiring and associated circuitry desired in this embodiment for writing and reading out information, so as to constitute the assembly as a magnetic memory.

Embodiments of the presently disclosed subject matter have been described above with reference to the drawings. However, some embodiments should not be considered as being limited by these embodiments. Furthermore, without deviation from the scope or from the gist of some embodiments, some embodiments may be implemented in modes in which various improvements, corrections, or modifications have been made thereto on the basis of knowledge possessed by a person having ordinary of ordinary skill in the art.

The disclosure of the following priority application is herein incorporated by reference: Japanese Patent Application No. 2015-103909, filed May 21, 2015.

REFERENCE SIGNS LIST

1: free layer
2: non-magnetic layer
3: fixed layer

The invention claimed is:

1. A non-collinear magnetoresistive device, using a large second-order anisotropy constant, comprising:
a free layer in a cone magnetization state at room temperature, a thickness of the free layer being from 1 nm to 10 nm, the free layer satisfying at room temperature expressions (1) to (4) below:

$$E_{RT} \geq 1.66 \times 10^{-19} \, J \quad (1)$$

$$V \leq 5 \times 10^4 \, nm^3 \quad (2)$$

$$K_{u2} > -(1/2)K_{u1,\mathit{eff}} \quad (3)$$

$$K_{u1,\mathit{eff}} < 0 \quad (4)$$

where
$E_{RT} = (K_{u1,\mathit{eff}} + K_{u2} + K_{u1,\mathit{eff}}^2 / 4K_{u2}) \times V$,
$K_{u1,\mathit{eff}}$: an effective first-order anisotropy constant,
$K_{u2}$: a second-order anisotropy constant, and
V: a volume;
a fixed layer which has an easy magnetization direction in an in-plane direction or in a perpendicular direction; and
a non-magnetic layer disposed between the free layer and the fixed layer.

2. The non-collinear magnetoresistive device according to claim 1, wherein the thickness of the free layer is from 1 nm to 3 nm.

3. The non-collinear magnetoresistive device according to claim 2, wherein
the free layer comprises one of:
(1) a multi-layer film in which a thin layer containing Co and a thin layer containing Pt or Pd are laminated repeatedly, or
(2) a superlattice film containing Pt or Pd, in addition to Co.

4. The non-collinear magnetoresistive device according to claim 1, wherein
the free layer comprises one of:
(1) a multi-layer film in which a thin layer containing Co and a thin layer containing Pt or Pd are laminated repeatedly, or
(2) a superlattice film containing Pt or Pd, in addition to Co.

5. A non-collinear magnetoresistive device, having a memory holding time of ten years or longer, comprising:
a free layer in a cone magnetization state at room temperature, a thickness of the free layer being from 1 nm to 10 nm, the free layer satisfying at room temperature expressions (1) and (2) below:

$$E_{RT} \geq 1.66 \times 10^{-19} \, J \quad (1)$$

$$V \leq 5 \times 10^4 \, nm^3 \quad (2)$$

where
$E_{RT} = (K_{u1,\mathit{eff}} + K_{u2} + K_{u1,\mathit{eff}}^2 / 4K_{u2}) \times V$,
$K_{u1,\mathit{eff}}$: an effective first-order anisotropy constant,
$K_{u2}$: a second-order anisotropy constant, and
V: a volume;
a fixed layer which has an easy magnetization direction in an in-plane direction or in a perpendicular direction; and
a non-magnetic layer disposed between the free layer and the fixed layer, wherein
the free layer satisfies at room temperature expressions (3) and (4) below.

$$K_{u2} > -(1/2)K_{u1,\mathit{eff}} \quad (3)$$

$$K_{u1,\mathit{eff}} < 0 \quad (4)$$

6. A non-collinear magnetoresistive device according to claim 5, wherein the thickness of the free layer being from 1 nm to 3 nm.

7. The non-collinear magnetoresistive device according to claim 6, wherein
the free layer comprises one of:
(1) a multi-layer film in which a thin layer containing Co and a thin layer containing Pt or Pd are laminated repeatedly, or
(2) a superlattice film containing Pt or Pd, in addition to Co.

8. The non-collinear magnetoresistive device according to claim 5, wherein
the free layer comprises one of:
(1) a multi-layer film in which a thin layer containing Co and a thin layer containing Pt or Pd are laminated repeatedly, or
(2) a superlattice film containing Pt or Pd, in addition to Co.

* * * * *